United States Patent
Ching

(10) Patent No.: US 9,502,565 B2
(45) Date of Patent: Nov. 22, 2016

(54) CHANNEL STRAIN CONTROL FOR NONPLANAR COMPOUND SEMICONDUCTOR DEVICES

(71) Applicant: Taiwan Semiconductor Manufacturing Company, Ltd., Hsin-Chu (TW)

(72) Inventor: Kuo-Cheng Ching, Zhubei (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 19 days.

(21) Appl. No.: 14/317,796

(22) Filed: Jun. 27, 2014

(65) Prior Publication Data

US 2015/0380556 A1    Dec. 31, 2015

(51) Int. Cl.
  *H01L 29/76*      (2006.01)
  *H01L 29/78*      (2006.01)
  *H01L 29/66*      (2006.01)
  *H01L 27/092*     (2006.01)
  *H01L 21/8238*    (2006.01)

(52) U.S. Cl.
  CPC ... *H01L 29/7849* (2013.01); *H01L 21/823807* (2013.01); *H01L 21/823821* (2013.01); *H01L 27/0924* (2013.01); *H01L 29/66795* (2013.01)

(58) Field of Classification Search
  CPC .......................... H01L 29/785; H01L 29/7849
  See application file for complete search history.

(56) References Cited

U.S. PATENT DOCUMENTS

| | | | |
|---|---|---|---|
| 6,800,910 B2 | 10/2004 | Lin et al. | |
| 7,485,520 B2 | 2/2009 | Zhu et al. | |
| 7,564,081 B2 | 7/2009 | Zhu et al. | |
| 2005/0285187 A1 | 12/2005 | Bryant et al. | |
| 2006/0068557 A1 | 3/2006 | Ochimizu et al. | |
| 2009/0256208 A1 | 10/2009 | Okano | |
| 2012/0299110 A1 | 11/2012 | Hung et al. | |
| 2014/0285980 A1* | 9/2014 | Cappellani ............. | H01L 21/76 361/748 |

FOREIGN PATENT DOCUMENTS

| | | |
|---|---|---|
| CN | 20091142924 | 5/2009 |
| DE | 102004020593 | 11/2005 |
| TW | 092112699 | 5/2003 |

(Continued)

OTHER PUBLICATIONS

Korean Office Action issued in Patent Application No. 10-2014-0170435 filed Dec. 2, 2014.

(Continued)

*Primary Examiner* — Elias M Ullah
(74) *Attorney, Agent, or Firm* — Haynes and Boone, LLP

(57) ABSTRACT

A circuit device having differently-strained NMOS and PMOS FinFETs is provided. In an exemplary embodiment, a semiconductor device includes a substrate with a first fin structure and a second fin structure formed thereup. The first fin structure includes opposing source/drain regions disposed above a surface of the substrate; a channel region disposed between the opposing source/drain regions and disposed above the surface of the substrate; and a first buried layer disposed between the channel region and the substrate. The first buried layer includes a compound semiconductor oxide. The second fin structure includes a second buried layer disposed between the substrate and a channel region of the second fin structure, such that the second buried layer is different in composition from the first. For example, the second fin structure may be free of the compound semiconductor oxide.

20 Claims, 14 Drawing Sheets

(56) References Cited

FOREIGN PATENT DOCUMENTS

| TW | 101146622 | 12/2012 |
| TW | 20134413 | 11/2013 |
| WO | WO 2013/154574 | 10/2013 |

* cited by examiner

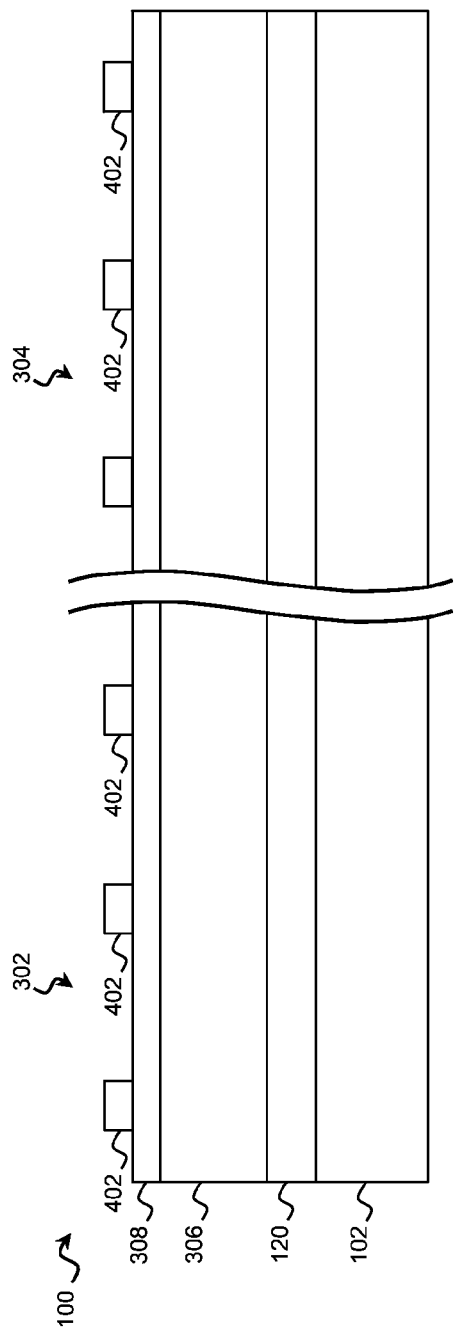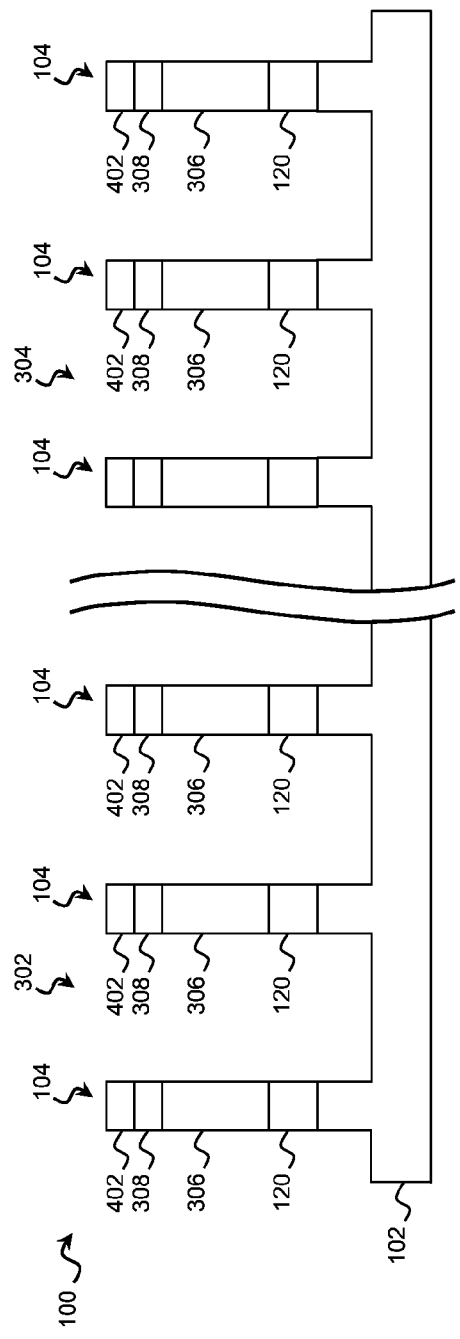

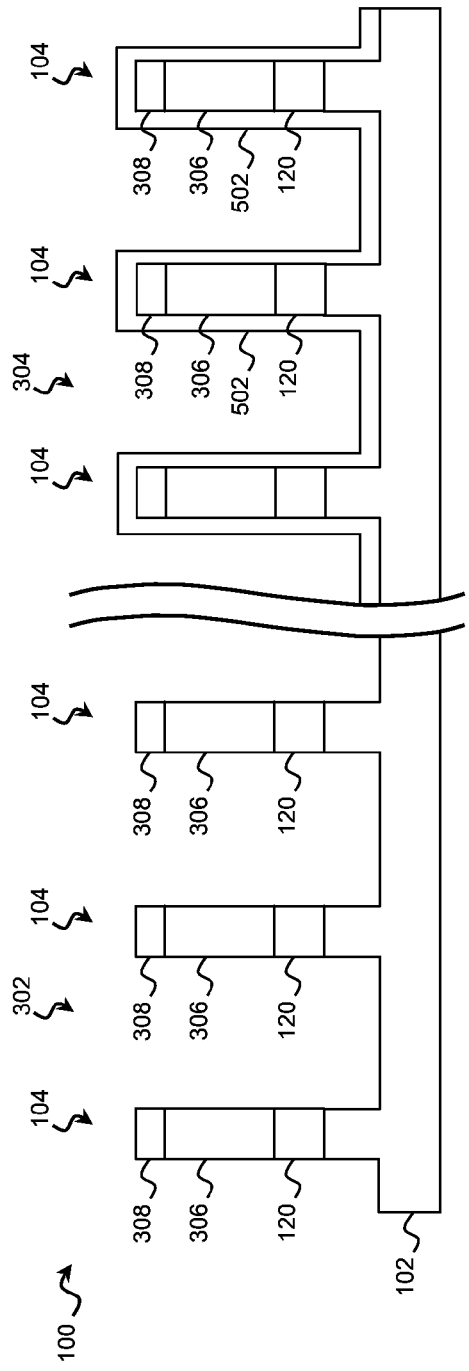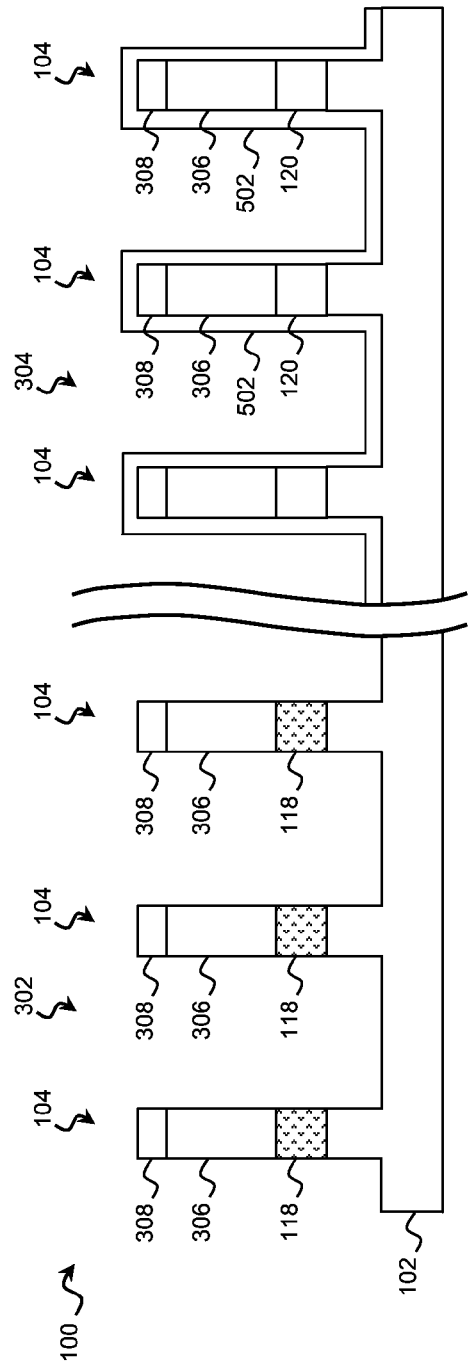

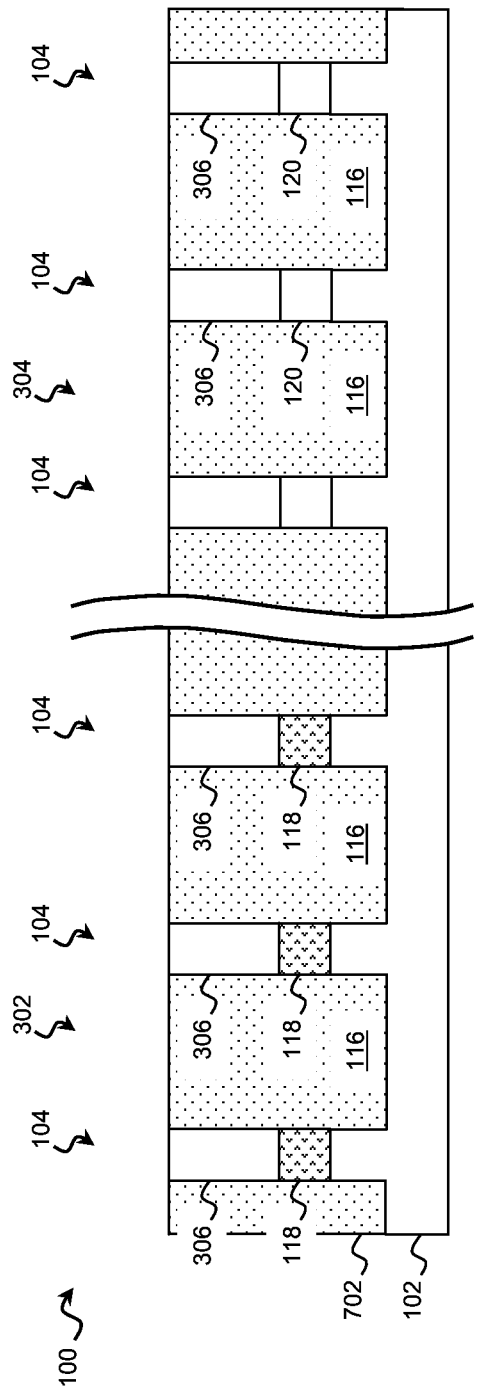
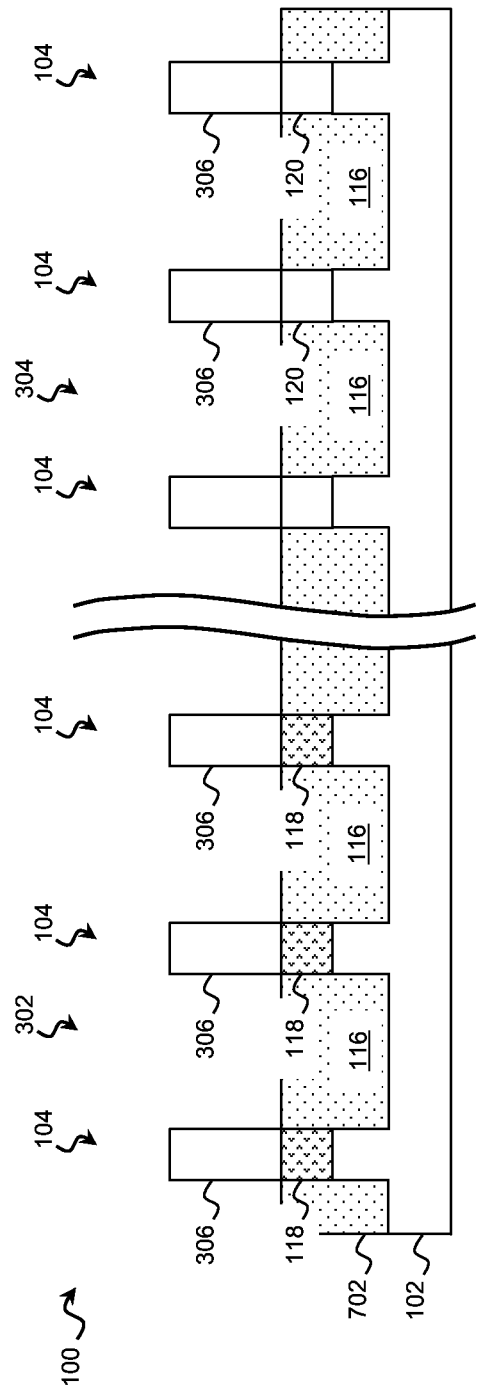

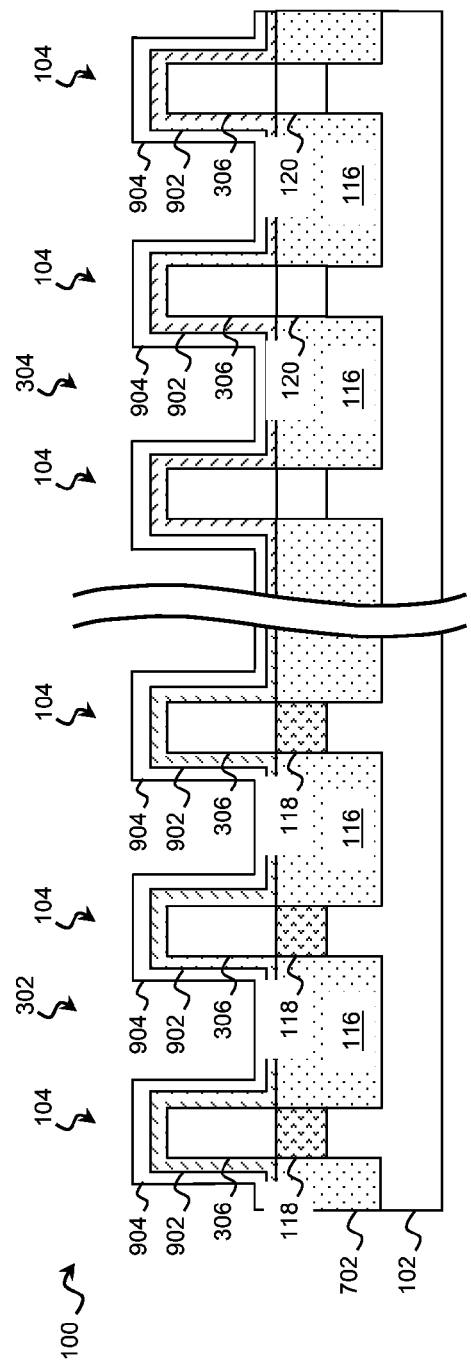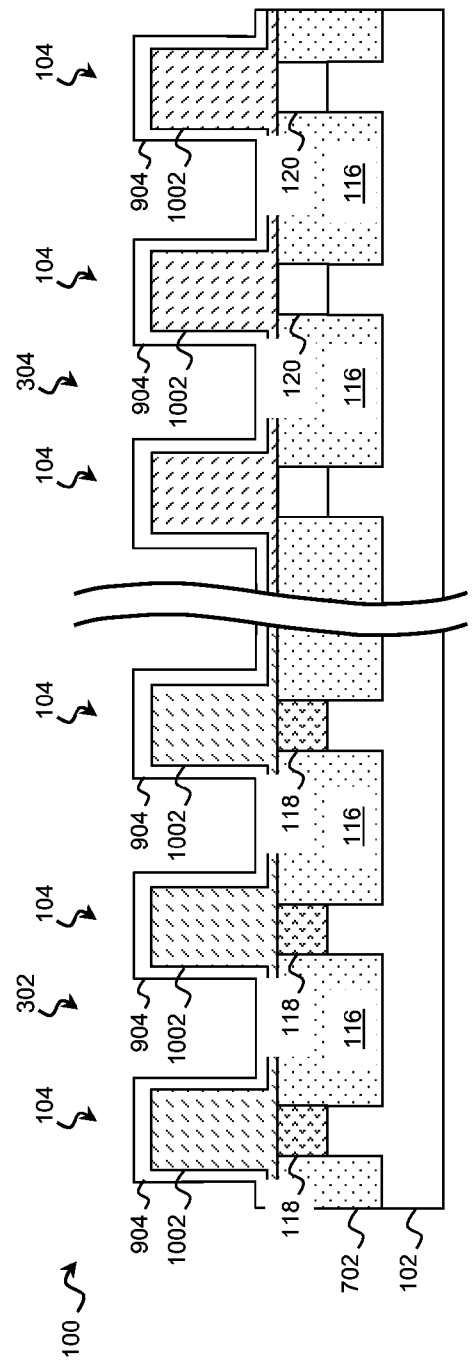

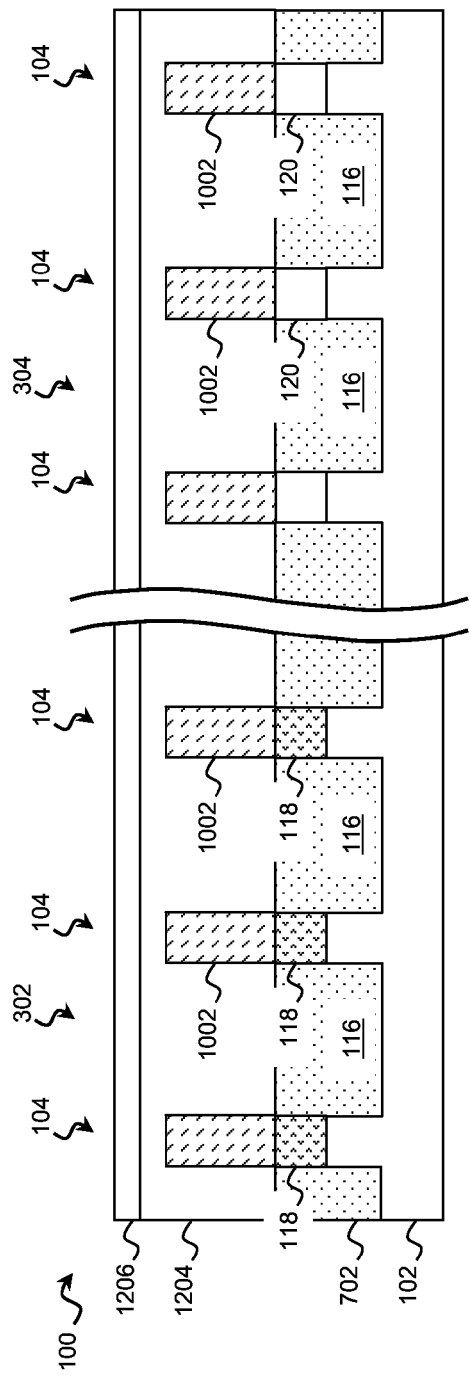
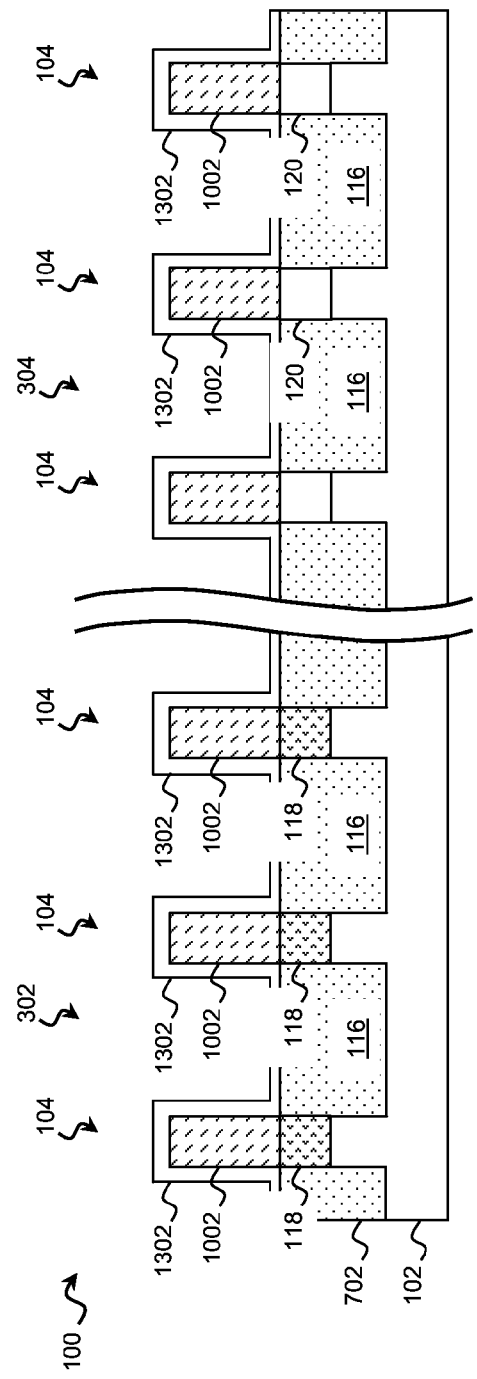
Figure 13A
Figure 13B

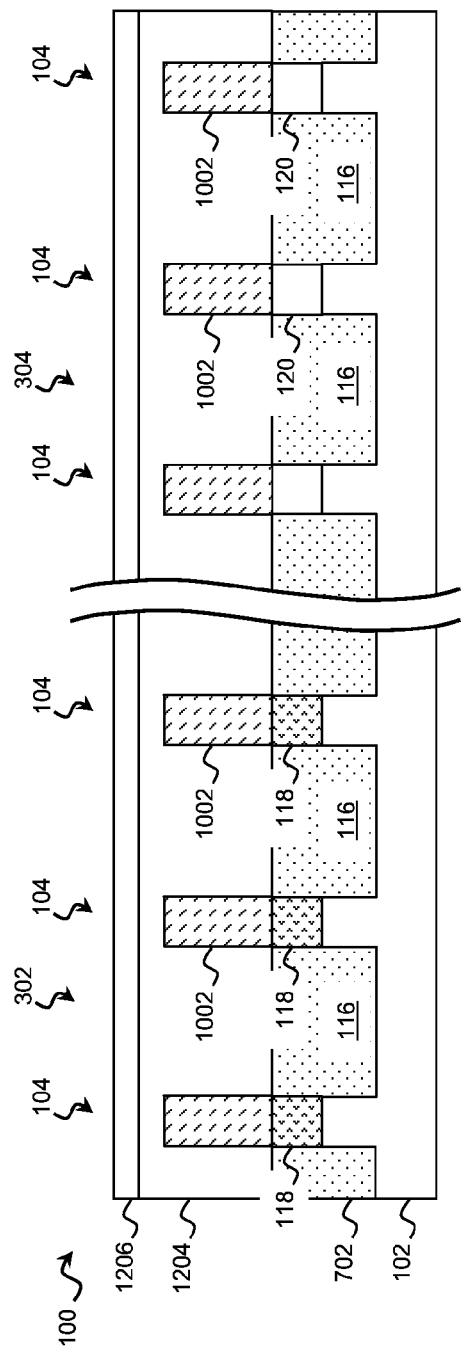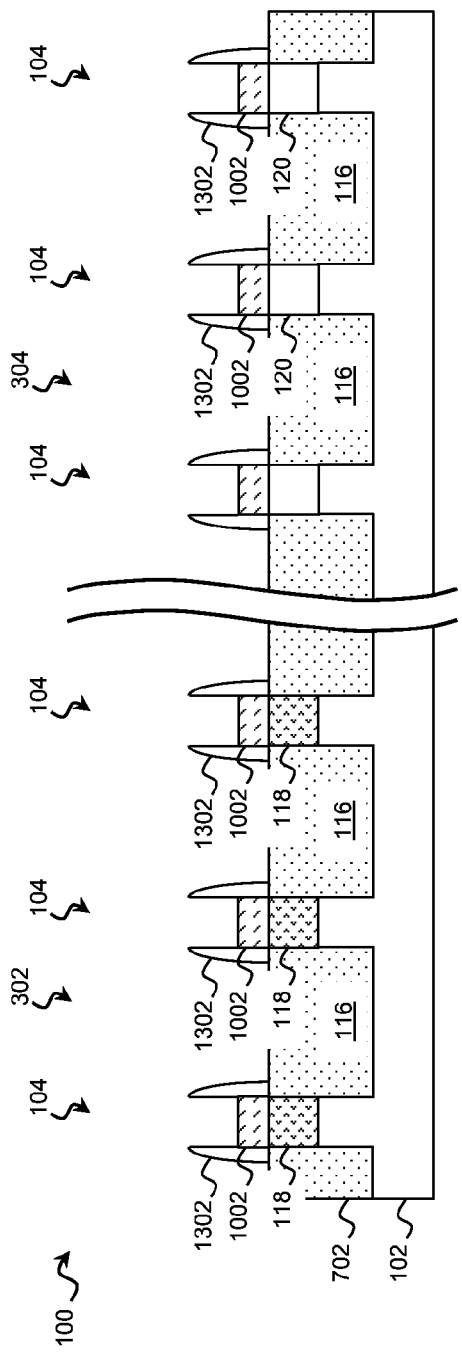

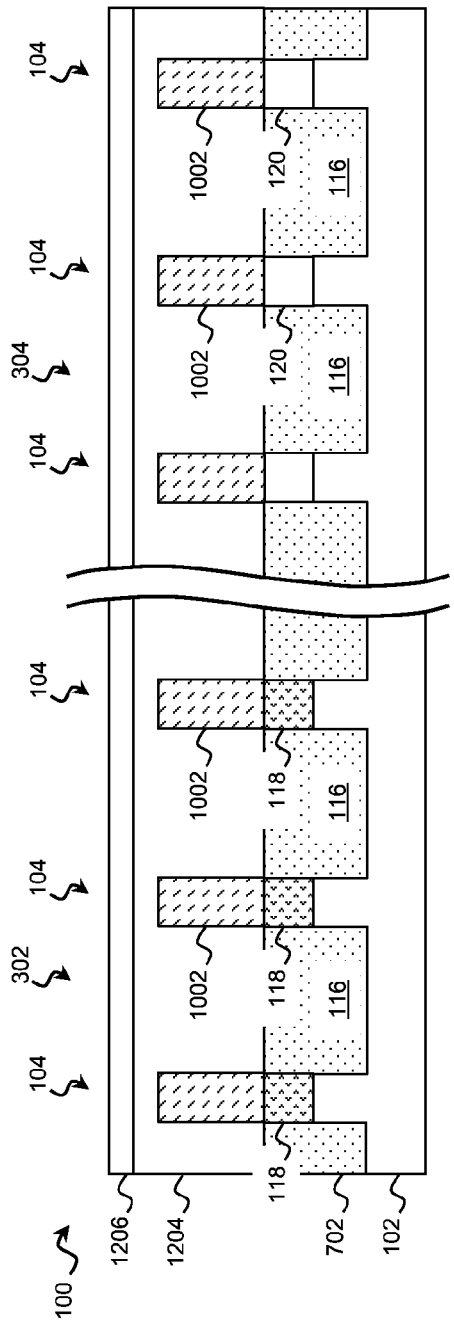
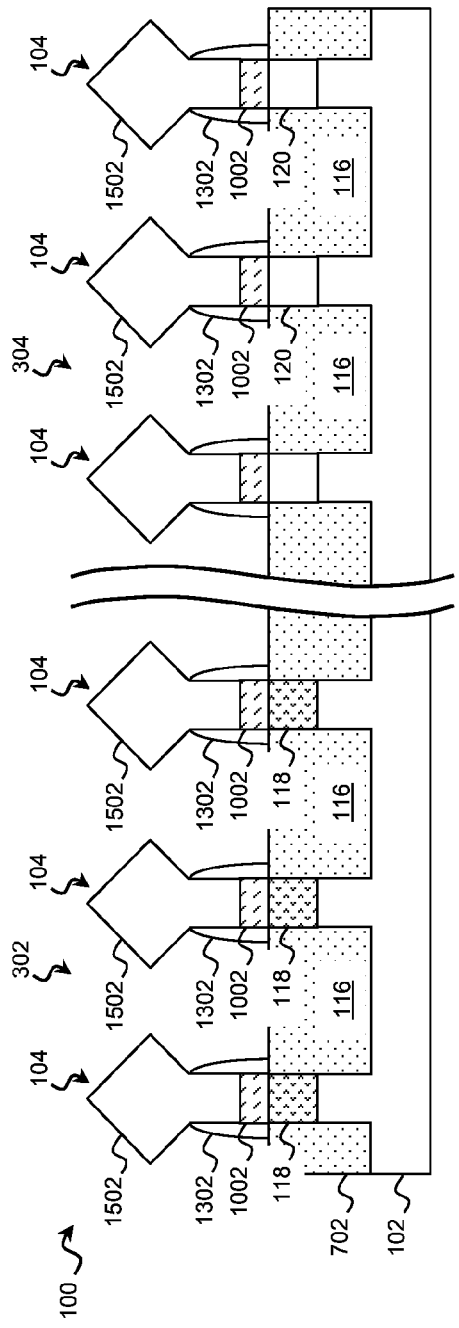
Figure 15A
Figure 15B

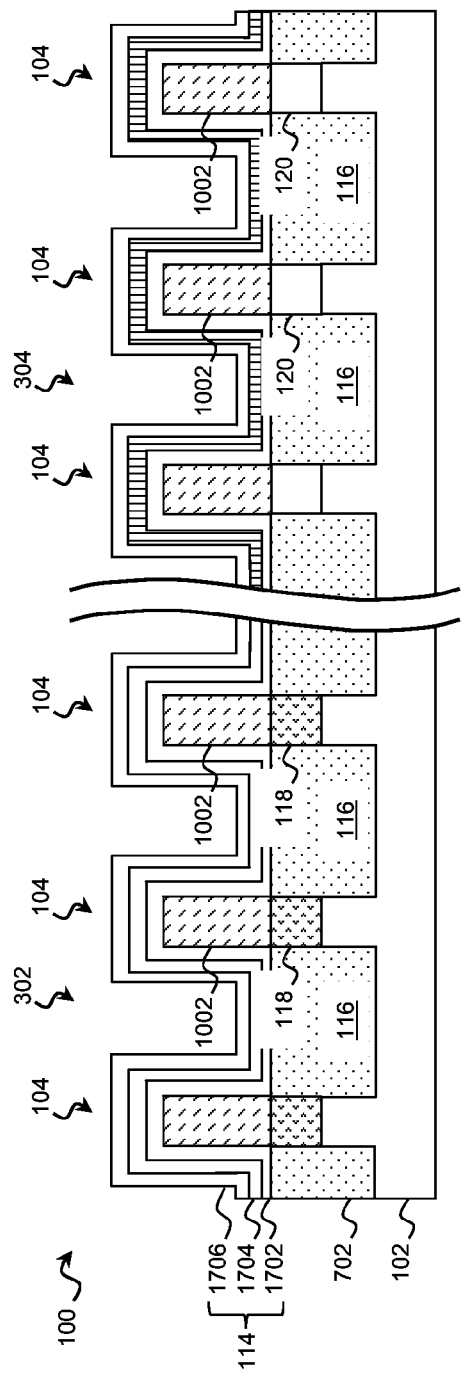
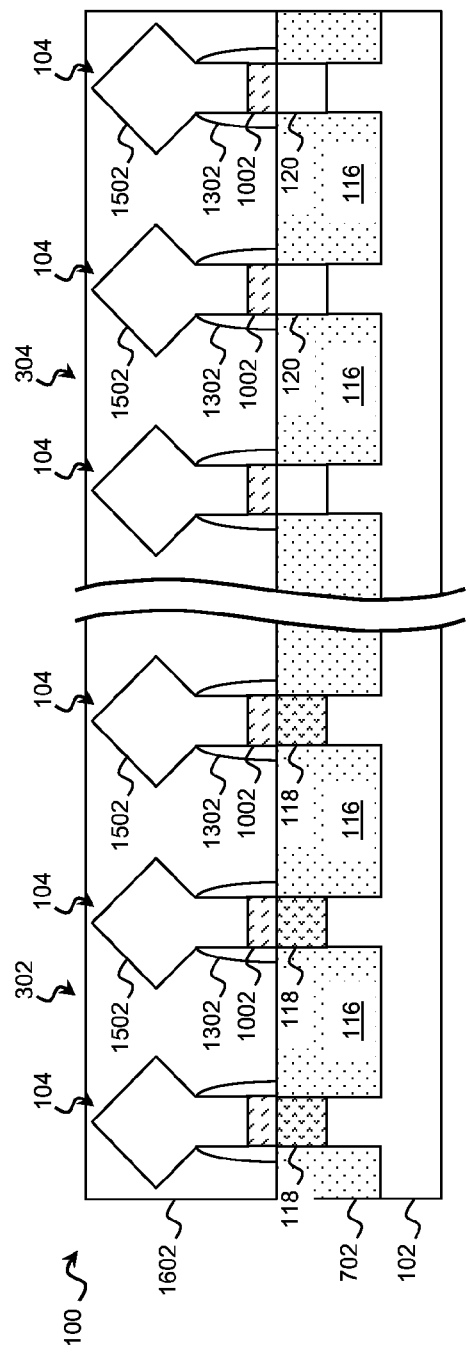

CHANNEL STRAIN CONTROL FOR NONPLANAR COMPOUND SEMICONDUCTOR DEVICES

BACKGROUND

The semiconductor industry has progressed into nanometer technology process nodes in pursuit of higher device density, higher performance, and lower cost. Despite groundbreaking advances in materials and fabrication, scaling planar device such as the conventional MOSFET has proven challenging. To overcome these challenges, circuit designers look to novel structures to deliver improved performance. One avenue of inquiry is the development of three-dimensional designs, such as a fin-like field effect transistor (FinFET). A FinFET can be thought of as a typical planar device extruded out of a substrate and into the gate. A typical FinFET is fabricated with a thin "fin" (or fin structure) extending up from a substrate. The channel of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

However, because of the complexity inherent in FinFETs and other nonplanar devices, a number of techniques used in manufacturing planar transistors are not well suited to fabricating nonplanar devices. As merely one example, conventional techniques for forming a compound semiconductor channel on an elementary semiconductor substrate may produce undesirable channel strains and/or lattice defects because of the different lattice structures of the different types of semiconductors. Likewise, conventional techniques are unable to effectively form a compound semiconductor oxide or other insulating feature between the channel region and the substrate. Therefore, while existing fabrication techniques have been generally adequate for planar devices, in order to continue to meet ever-increasing design requirements, further advances are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3-11 are cross-sectional views of a portion of a workpiece undergoing the method for forming a FinFET taken along a first plane according to various aspects of the present disclosure.

FIGS. 13A, 14A, 15A, 16A, and 17A are cross-sectional views of a portion of the workpiece undergoing the method for forming a FinFET taken along the first plane according to various aspect of the present disclosure.

FIGS. 13B, 14B, 15B, 16B, and 17B are cross-sectional views of a portion of the workpiece undergoing the method for forming a FinFET taken along a second plane according to various aspect of the present disclosure.

DETAILED DESCRIPTION

Figure 1:
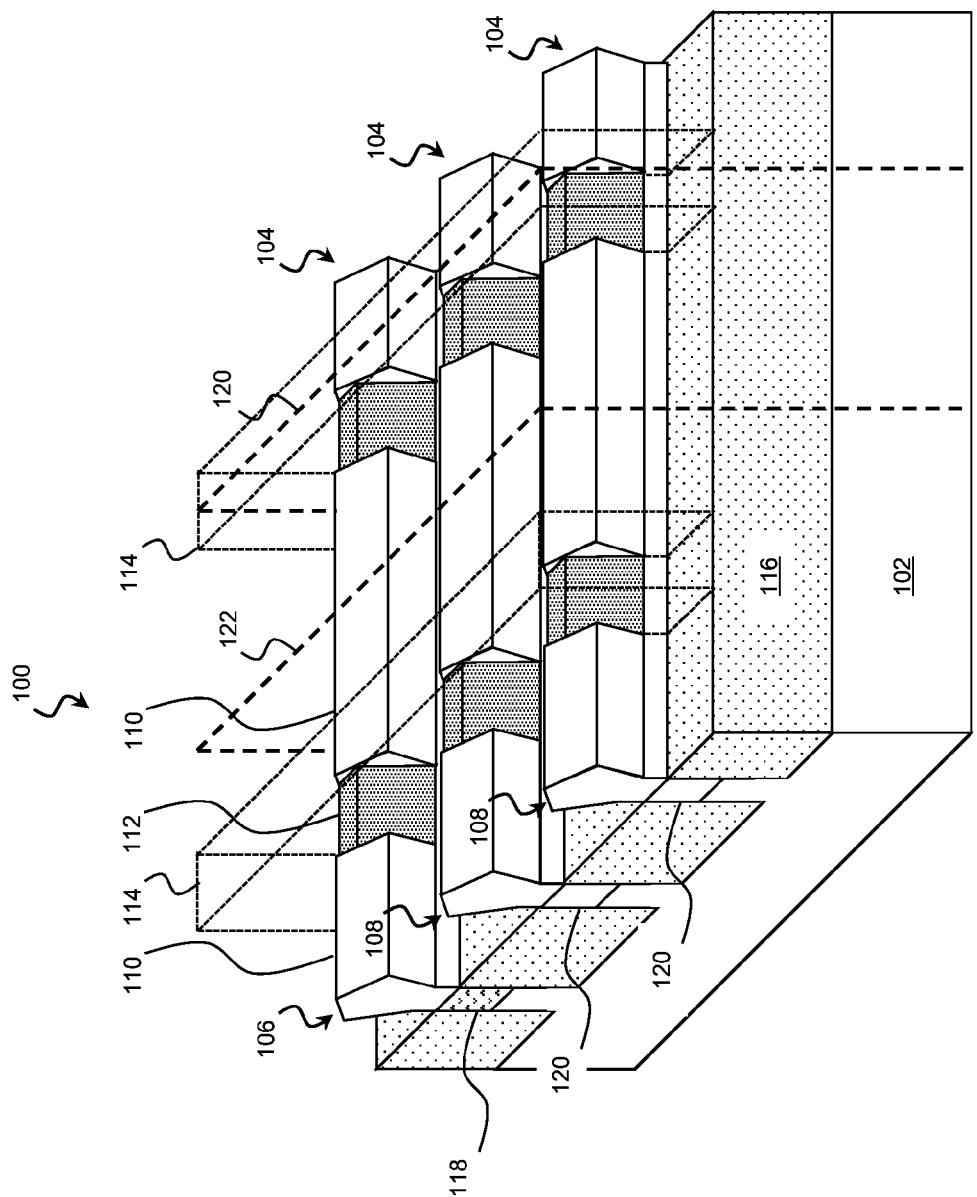
FIG. 1 is a perspective view of a portion of a workpiece according to various aspects of the present disclosure.

The present disclosure relates generally to IC device manufacturing and, more particularly, to an insulating layer that isolates a FinFET from a substrate upon which it is formed and to tuning the channel strain generated by the insulating layer to suit the channel type of the FinFET.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a perspective view of a portion of a workpiece 100 according to various aspects of the present disclosure. FIG. 1 has been simplified for the sake of clarity and to better illustrate the concepts of the present disclosure. Additional features may be incorporated into the workpiece 100, and some of the features described below may be replaced or eliminated for other embodiments of the workpiece 100.

The workpiece 100 includes a substrate 102 or wafer with one or more fin structures 104 formed upon it. The fin structures 104 are representative of any raised feature, and while the illustrated embodiments include FinFET fin structures 104, further embodiments include other raised active and passive devices formed upon the substrate 102. The illustrated fin structures 104 include an n-channel (NMOS) FinFET 106 and a p-channel (PMOS) FinFET 108. In turn, each of FinFETs 106 and 108 comprises a pair of opposing source/drain regions 110, which may include various doped semiconductor materials, and a channel region 112 disposed between the source/drain regions 110. The flow of carriers (electrons for the n-channel device and holes for the p-channel device) through the channel region 112 is controlled by a voltage applied to a gate stack 114 adjacent to and overwrapping the channel region 112. The gate stack 114 is shown as translucent to better illustrate the underlying channel region 112. In the illustrated embodiment, the channel region 112 rises above the plane of the substrate 102 upon which it is formed, and accordingly, the fin structure 104 may be referred to as a "nonplanar" device. The raised channel region 112 provides a larger surface area proximate to the gate stack 114 than comparable planar devices. This strengthens the electromagnetic field interactions between the gate stack 114 and the channel region 112, which may reduce leakage and short channel effects associated with smaller devices. Thus in many embodiments, FinFETS 106 and 108, and other nonplanar devices deliver better performance in a smaller footprint than their planar counterparts.

As described in more detail below, the fin structures 104 are formed on a semiconductor substrate 102. To electrically isolate the corresponding FinFETS 106 and 108 from the semiconductor substrate 102, the fin structures 104 are separated by isolation features 116 horizontally and buried layers 118 and 120 vertically. In various embodiments, the methods and structures of the present disclosure provide a first type of buried layer 118 for NMOS FinFETs 106 and a second type of buried layer 120 for PMOS FinFETs 108. This allows the buried layers 118 and 120 to be individually adapted to suit the respective device. For example, in some embodiments, the buried layers 118 and 120 are configured to impart different channel strains, each adapted for the particular type of FinFET device. In general, compressive strain on a channel region 112 improves the carrier mobility of PMOS devices, while tensile strain improves the carrier mobility of NMOS devices. Accordingly, in some such embodiments, the buried layer 118 of the NMOS FinFETs 106 is configured to impart a tensile strain, and the buried layer 120 of the PMOS FinFETs 108 is configured to impart a compressive strain.

In another example, the buried layers 118 and 120 are configured to reduce the incidence of undesired lattice dislocations. Many semiconductor materials have an atomic lattice made up of a repeating arrangement of bonded atoms. The lattice shape and spacing is often unique to a particular material, and differences in the lattice structures between materials may cause irregularities at the interface between the materials. In turn, these irregularities may result in lattice dislocations and other non-uniformities that propagate throughout the respective material. Unintended dislocations can cause a loss of channel strain, increased leakage current, and even physical damage to the fin structure 104. Thus, in some embodiments, the buried layers 118 and 120 are configured to reduce the occurrence of such dislocations. By doing so, the buried layers 118 and 120 allow the use of materials (e.g., high Ge concentration SiGe) with even greater differences in lattice structure.

Exemplary methods of forming FinFET devices 106 and 108 will now be described with reference to FIGS. 2A-17B. The figures that follow refer to cross-sections taken through the channel region 112 (e.g., along plane 120) and/or through the source/drain regions 110 (e.g., along plane 122) of the FinFET devices 106 and 108. For reference, these cross-sectional planes 120 and 122 are shown in FIG. 1.

Figure 2A:
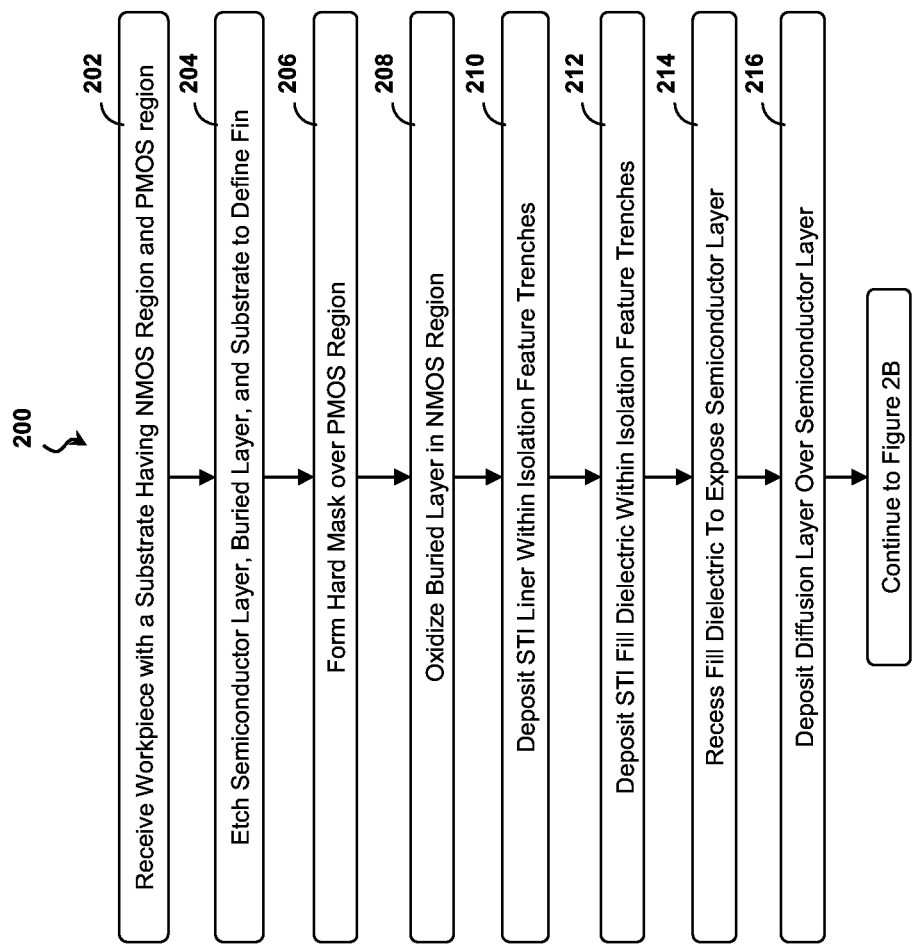
FIGS. 2A and 2B are flow diagrams of a method for fabricating a FinFET or other fin-based device on a workpiece according to various aspects of the present disclosure.
Figure 2B:
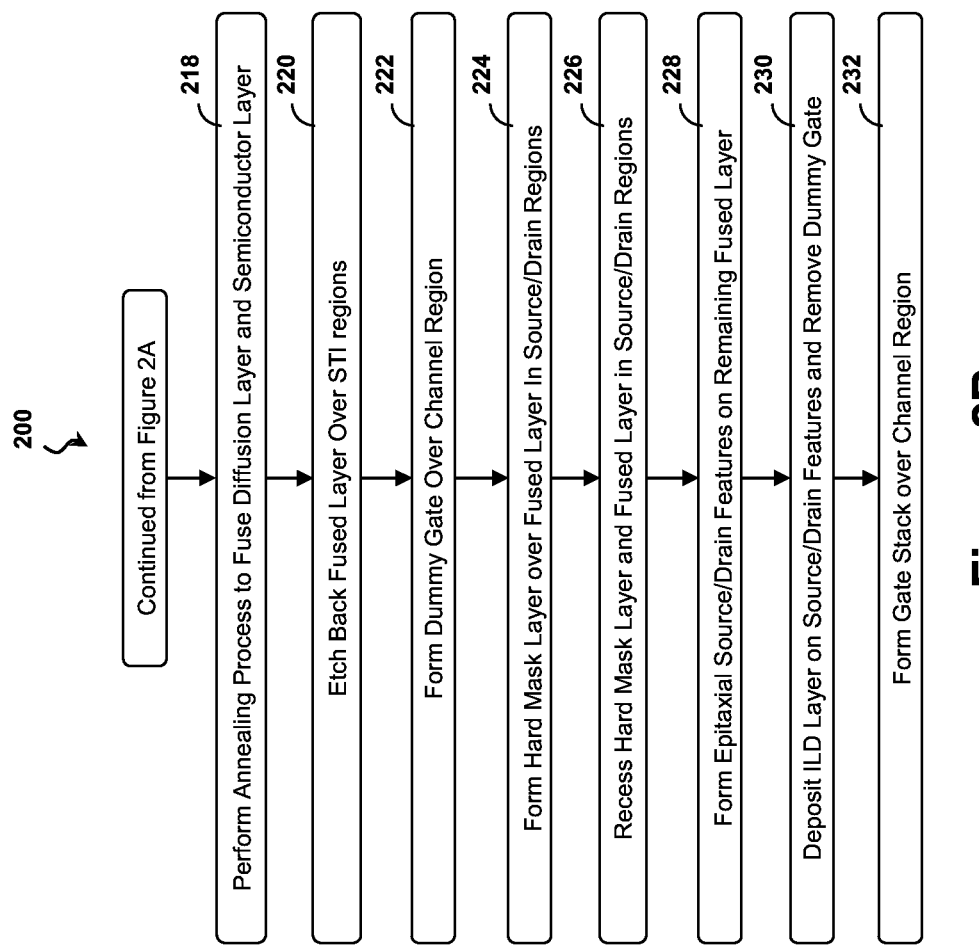

FIGS. 2A and 2B are flow diagrams of a method 200 for fabricating a FinFET or other fin-based device on a workpiece 100 according to various aspects of the present disclosure. It is understood that additional steps can be provided before, during, and after the method 200 and that some of the steps described can be replaced or eliminated for other embodiments of the method. FIGS. 3-11 are cross-sectional views of a portion of the workpiece 100 undergoing the method, where the cross section is taken through the channel region 112 (along plane 120). Throughout the corresponding processes of blocks 202-220, the source/drain regions 110 and the channel regions 112 undergo substantially similar processes. To avoid unnecessary duplication, the substantially similar cross-sectional views showing a cross section taken along the source/drain regions 110 are omitted. However, for the latter processes, both channel region 112 and source/drain region 110 cross sections are provided. In that regard, FIGS. 13A, 14A, 15A, 16A, and 17A are cross-sectional views of a portion of the workpiece 100, where the cross-section is taken through the channel region 112 (along plane 120), according to various aspect of the present disclosure. FIGS. 13B, 14B, 15B, 16B, and 17B are cross-sectional views of a portion of the workpiece 100, where the cross section is taken through a source/drain region 110 (along plane 122), according to various aspects of the present disclosure. FIG. 12 is a perspective view of a portion of the workpiece 100 undergoing the method 200 according to various aspects of the present disclosure. FIGS. 3-17B have been simplified for the sake of clarity and to better illustrate the concepts of the present disclosure.

Referring first to block 202 of FIG. 2 and to FIG. 3, a workpiece 100 is received that includes a substrate 102. The substrate 102 may be divided into a first region for forming an NMOS FinFET, referred to as an NMOS region 302, and a second region for forming a PMOS FinFET, referred to as a PMOS region 304. The NMOS region 302 may be adjacent to or separate from the PMOS region 304, and a variety of isolation features including trench isolation features 116 and/or dummy devices may be formed between the regions. In the embodiments described in detail below, FinFETs are formed in the NMOS region 302 and PMOS region 304. However, it is understood that these FinFETs are representative of any raised structure, and further embodiments include other raised active and passive devices formed upon the substrate 102.

Suitable substrates 102 include a bulk silicon substrate. Alternatively, the substrate 102 may comprise an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods.

The received substrate 102 may have one or more layers already formed upon it. In the illustrated embodiment, the substrate 102 includes a buried layer 120. The buried layer 120 physically and electrically isolates the FinFET from the substrate 102. Although the buried layer 120 is formed in both the NMOS region 302 and the PMOS region 304, in some embodiments, the buried layer 120 is initially configured for forming a PMOS device. For example, the buried layer 120 may be configured to produce compressive strain in the channel region 112 of the PMOS. In such embodiments, the portion of the buried layer 120 in the NMOS region 302 is subsequently modified to be better suited for forming an NMOS device.

To produce a compressive strain, the buried layer 120 may include a compound semiconductor formed on and physically contacting an elementary semiconductor of the substrate 102. For example, in various embodiments, the buried layer 120 includes SiGe with a Ge concentration of between about 20 atomic percent and about 35 atomic percent and is formed on an elementary Si substrate 102. The germanium atoms change the spacing of the crystalline lattice of the SiGe semiconductor compared to the elementary Si lattice of the substrate 102. Due in part to this different spacing, the interface between the exemplary SiGe buried layer 120 and the Si semiconductor substrate 102 produces an internal strain in the buried layer 120 and the surrounding layers. While strain is generally beneficial, too great a strain may lead to the aforementioned dislocations in the crystalline structure, which may hinder device performance. Accordingly, the buried layer 120 may have an intermediate Ge concentration such as between about 20 atomic percent and about 35 atomic percent. In further embodiments, the buried layer 120 has a Ge gradient such that a portion of the buried layer 120 closest to and contacting the substrate 102 has a Ge concentration between about 20 atomic percent and about 35 atomic percent, while a portion of the buried layer 120 furthest from the substrate 102 has a Ge concentration of about 60 atomic percent.

The buried layer 120 may be formed on the substrate 102 by any suitable process, and in one such example, the buried layer 120 is epitaxially grown on the substrate 102. Other suitable deposition processes include atomic layer deposition (ALD), chemical vapor deposition (CVD), high-density plasma CVD (HDP-CVD), physical vapor deposition (PVD) and/or other suitable deposition processes. Any of these techniques may be used to grow a buried layer 120 having any composition including a graduated composition. For example, in an exemplary epitaxial growth process, the concentration of a Ge-containing reaction gas (e.g., $GeH_4$) is varied over time as the buried layer 120 grows to deposit a buried layer 120 with a Ge gradient. The buried layer 120 may be formed to any suitable thickness, and in various embodiments, ranges in thickness from about 20 nm to about 90 nm.

In the illustrated embodiment, a semiconductor layer 306 is formed on and directly contacting the buried layer 120 in both the NMOS region 302 and the PMOS region 304. The semiconductor layer 306 is processed to form the core of the fin structure 104 as described below. As such, the semiconductor layer 306 may include any suitable elementary or compound semiconductor, and in an exemplary embodiment, includes an elementary Si semiconductor. Similar to the buried layer, the semiconductor layer 306 may be formed by epitaxy, ALD, CVD, HDP-CVD, PVD, and/or other suitable deposition processes.

To facilitate fabrication and to avoid damage to the semiconductor layer 306, one or more hard mask layers 308 are formed on the semiconductor layer 306. The hard mask layers 308 include a dielectric such as a semiconductor oxide, a semiconductor nitride, a semiconductor oxynitride, and/or a semiconductor carbide, and in an exemplary embodiment, the hard mask layers 308 include a silicon oxide layer and a silicon nitride layer. The hard mask layers 308 may be formed by thermal growth, ALD, chemical vapor deposition (CVD), high-density plasma CVD (HDP-CVD), physical vapor deposition (PVD), and/or other suitable deposition processes.

A photoresist layer 402 (shown after patterning) used to define fin structures 104 in later steps of the method 200 may be formed on the hard mask layers 308. An exemplary photoresist layer 402 includes a photosensitive material that causes the layer to undergo a property change when exposed to light. This property change can be used to selectively remove exposed or unexposed portions of the photoresist layer in a process referred to as lithographic patterning.

Referring to block 204 of FIG. 2 and to FIG. 4, the hard mask layers 308 are opened and the semiconductor layer 306, the buried layer 120, and the substrate 102 are etched to define the fin structures 104. In some embodiments, photolithography is used to define the areas of the workpiece 100 to be etched. For example, in one such embodiment, opening the hard mask layers 308 and etching the workpiece 100 in block 204 includes forming a photoresist layer 402 over the hard mask layers 308 and developing the photoresist 402 to expose the portions of the hard mask layers 308 that are to be recessed by the etchant. An exemplary patterning process includes soft baking of the photoresist layer 402, mask aligning, exposure, post-exposure baking, developing the photoresist layer 402, rinsing, and drying (e.g., hard baking). Alternatively, a photolithographic process may be implemented, supplemented, or replaced by other methods such as maskless photolithography, electron-beam writing, and ion-beam writing.

In the embodiment of FIG. 4, the photoresist layer 402 is patterned to leave the portion of the photoresist material disposed over the fin structures 104. After patterning the photoresist 402, one or more etching processes are performed on the workpiece to open the hard mask layers 308 and to etch the portions of the semiconductor layer 306, the buried layer 120, and the substrate 102 not covered by the photoresist 402. The etching processes may include any suitable etching technique such as dry etching, wet etching, and/or other etching methods (e.g., reactive ion etching (RIE)). In some embodiments, etching includes multiple etching steps with different etching chemistries, each targeting a particular material of the workpiece 100. For example, in an embodiment, the substrate 102 is etched by a dry etching process using a fluorine-based etchant.

The etching is configured to produce fin structures 104 of any suitable height and width extending above the reminder of the substrate 102. In addition to defining the fin structures 104, the etching of block 204 may also define one or more isolation feature trenches between the fin structures 104. The trenches may be subsequently filled with a dielectric material to form an isolation feature 116, such as a shallow trench isolation feature (STI). After etching, the remaining photoresist layer 402 may be removed.

Referring to block 206 of FIG. 2 and to FIG. 5, a second hard mask 502 is formed over the PMOS region 304. The second hard mask 502 protects the PMOS region 304 from processing while exposing the NMOS region 302. The second hard mask 502 may include any suitable dielectric material, and an exemplary second hard mask 502 includes a semiconductor nitride. In the illustrated embodiment, the second hard mask 502 is formed on the upper surface of the fin structures 104 (i.e., on the upper surface of the hard mask layers 308), on the sidewall surfaces of the fin structures 104, and on the horizontal trench surfaces between the fin structures 104 in the PMOS region 304. In this way, the second hard mask 502 protects these exterior surfaces of the fin structures 104.

In order to protect only the PMOS region 304, the second hard mask 502 may be formed on both regions 302 and 304 and selectively etched or otherwise removed from the NMOS region 302. In an embodiment, a photoresist layer is deposited on the second hard mask 502 after the second hard mask 502 is formed over both regions 302 and 304. The photoresist layer is exposed and patterned to expose the portion of the second hard mask 502 disposed within the NMOS region 302 for etching. The photoresist layer may be removed after the second hard mask 502 has been removed from the NMOS region 302.

Referring to block 208 of FIG. 2 and to FIG. 6, the buried layer 120 within the NMOS region 302 is oxidized. The oxidized buried layer 120 corresponds to the NMOS buried layer 118 of FIG. 1. This oxidation process makes the buried layer 120 more suitable for an NMOS FinFET. Accordingly, in some embodiments, the oxidation of the buried layer 120 relieves the compressive strain and instead produces tensile strain within the buried layer 120 and surrounding layers. Any suitable oxidation process may be used to oxidize the NMOS buried layer 118, and in an exemplary embodiment, a wet oxidation process is used because it tends to selectively oxidize Ge within the buried layer 118 without oxidizing Si within the substrate 102 and/or semiconductor layer 306. For example, the substrate 102 may be heated to and maintained at between about 400° C. and about 600° C. while pure water (vapor) is supplied to the substrate 102 in an environment maintained at about 1 Atm of pressure for between about thirty minutes and about one hour. The oxidation technique forms a SiGe oxide buried layer 118 in the NMOS region 302. In contrast, the second hard mask 502 prevents oxidation within the PMOS region 304 and keeps the buried layer 120 within the PMOS region free of oxide. After the oxidation of the NMOS buried layer 118, the second hard mask 502 may be removed.

An STI or other type of isolation feature may be formed between the fin structures 104 as shown in blocks 210-214. Referring first to block 210 of FIG. 2, an STI liner (not shown) may be formed within the isolation feature trenches of the workpiece 100. The liner reduces crystalline defects at the interface between the substrate 102 and the fill material. The liner may include any suitable material including a semiconductor nitride, a semiconductor oxide, a thermal semiconductor oxide, a semiconductor oxynitride, a polymer dielectric, and/or other suitable materials, and may be formed using any suitable deposition process including thermal growth, ALD, CVD, HDP-CVD, PVD, and/or other suitable deposition processes. In some embodiments, the liner includes a conventional thermal oxide liner formed by a thermal oxidation process. In some exemplary embodiments, the liner includes a semiconductor nitride formed via HDP-CVD.

Referring to block 212 of FIG. 2 and referring to FIG. 7, an STI fill material 702 or fill dielectric is then deposited within the isolation feature trenches to form the isolation features 116. Suitable fill materials 702 include semiconductor oxides, semiconductor nitrides, semiconductor oxynitrides, FSG, low-K dielectric materials, and/or combinations thereof. In various exemplary embodiments, the fill material 702 is deposited using a HDP-CVD process, a sub-atmospheric CVD (SACVD) process, a high-aspect ratio process (HARP), and/or a spin-on process. In one such embodiment, a CVD process is used to deposit a flowable dielectric material that includes both a dielectric fill material 702 and a solvent in a liquid or semiliquid state. A curing process is used to drive off the solvent, leaving behind the dielectric fill material 702 in its solid state.

The deposition of the fill material 702 may be followed by a chemical mechanical polishing/planarization (CMP) process. The CMP process may use the hard mask layers 308 as a CMP stop to prevent planarizing the semiconductor layer 306. In the illustrated embodiment, the CMP process completely removes the hard mask layers 308, although in further embodiments, some portion of the hard mask layers 308 remain after the CMP process.

Referring to block 214 of FIG. 2 and to FIG. 8, the fill material 702 is recessed to expose the semiconductor layer 306. This allows the semiconductor layer 306 to be selectively processed in subsequent steps. In the illustrated embodiment, the fill material 702 is recessed to expose the semiconductor layer 306 in its entirety. In this embodiment, the fill material 702 is recessed until the upper surface of the fill material 702 is substantially coplanar with the upper surfaces of the buried layers 118 and 120. Any suitable etching technique may be used to recess the fill material 702 including dry etching, wet etching, RIE, and/or other etching methods, and in an exemplary embodiment, an anisotropic dry etching is used to selectively remove the fill material 702 without etching the semiconductor layer 306.

Referring to block 216 of FIG. 2 and to FIG. 9, a diffusion layer 902 is deposited over the semiconductor layer 306. The diffusion layer 902 may be used to introduce new materials such as new semiconductors and/or dopants into the semiconductor layer 306. In an exemplary embodiment, a Ge-containing diffusion layer 902 (e.g., Ge, SiGe, etc.) is used in conjunction with an elementary Si semiconductor layer to form an SiGe compound semiconductor. The thickness of the Ge-containing diffusion layer 902 is selected to produce a final composition within a desired range (e.g., SiGe with Ge at a concentration between about 20 atomic percent and 70 atomic percent).

There are several advantages to using a diffusion layer in conjunction with the semiconductor layer 306. For example, introducing Ge to the semiconductor layer 306 after oxidizing the NMOS buried layer 118 may prevent the semiconductor layer 306 from being oxidized during the oxidization of the buried layer 118. As another example, the use of a diffusion layer 902 may allow the formation of SiGe with higher Ge concentration than conventional techniques such as epitaxy. As a further exemplary advantage, by controlling the thickness of the diffusion layer 902 in the NMOS region 302 independently of the thickness in the PMOS region 304 the amount of diffused material can be controlled can be adapted to the respective FinFETs. Accordingly in an embodiment, the diffusion layer 902 is configured to produce a first Ge concentration in the NMOS region 302 and a second Ge concentration in the PMOS region 304 that is different than the first.

The diffusion layer 902 may be deposited by any suitable technique to any desired thickness. In various exemplary embodiments, the diffusion layer 902 contains Ge and/or SiGe and is formed by epitaxy, ALD, CVD, HDP-CVD, PVD, and/or other suitable deposition processes. A capping layer 904, such as a silicon oxide capping layer, may be formed on the diffusion layer 902.

Referring to block 218 of FIG. 2 and to FIG. 10, an annealing process is used to fuse the semiconductor layer 306 and the diffusion layer 902 to form a fused layer 1002. In an exemplary process, the annealing includes heating the workpiece 100 to between about 900° C. and about 1000° C. At this temperature range, solid phase diffusion and other physical processes cause the materials of the diffusion layer 902 to permeate into the semiconductor layer 306. As a result, the fused layer 1002 may have a uniform concentration of the atoms of the diffusion layer 902 material and the atoms of the semiconductor layer 306 material. In an exemplary embodiment, the fused layer 1002 includes SiGe with a Ge concentration between about 20 atomic percent and 70 atomic percent. As described above, this is a higher Ge concentration than can be obtained using many conventional epitaxy techniques, and the buried layers 118 and 120 keep potential dislocations, which may result from high-Ge concentration materials, in check.

Figure 11:
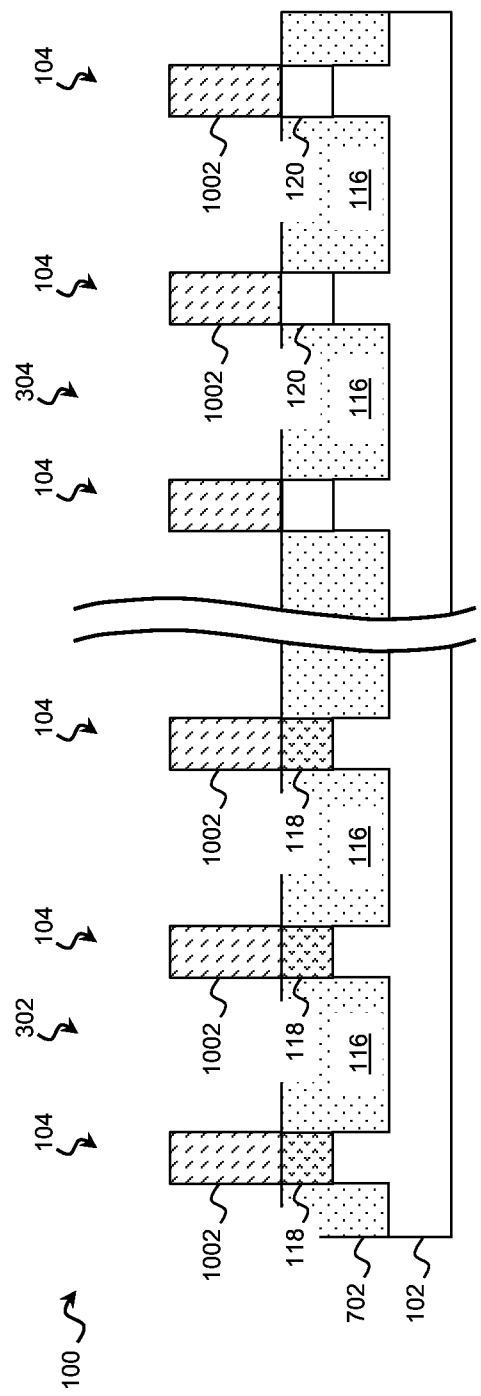
Figure 12:
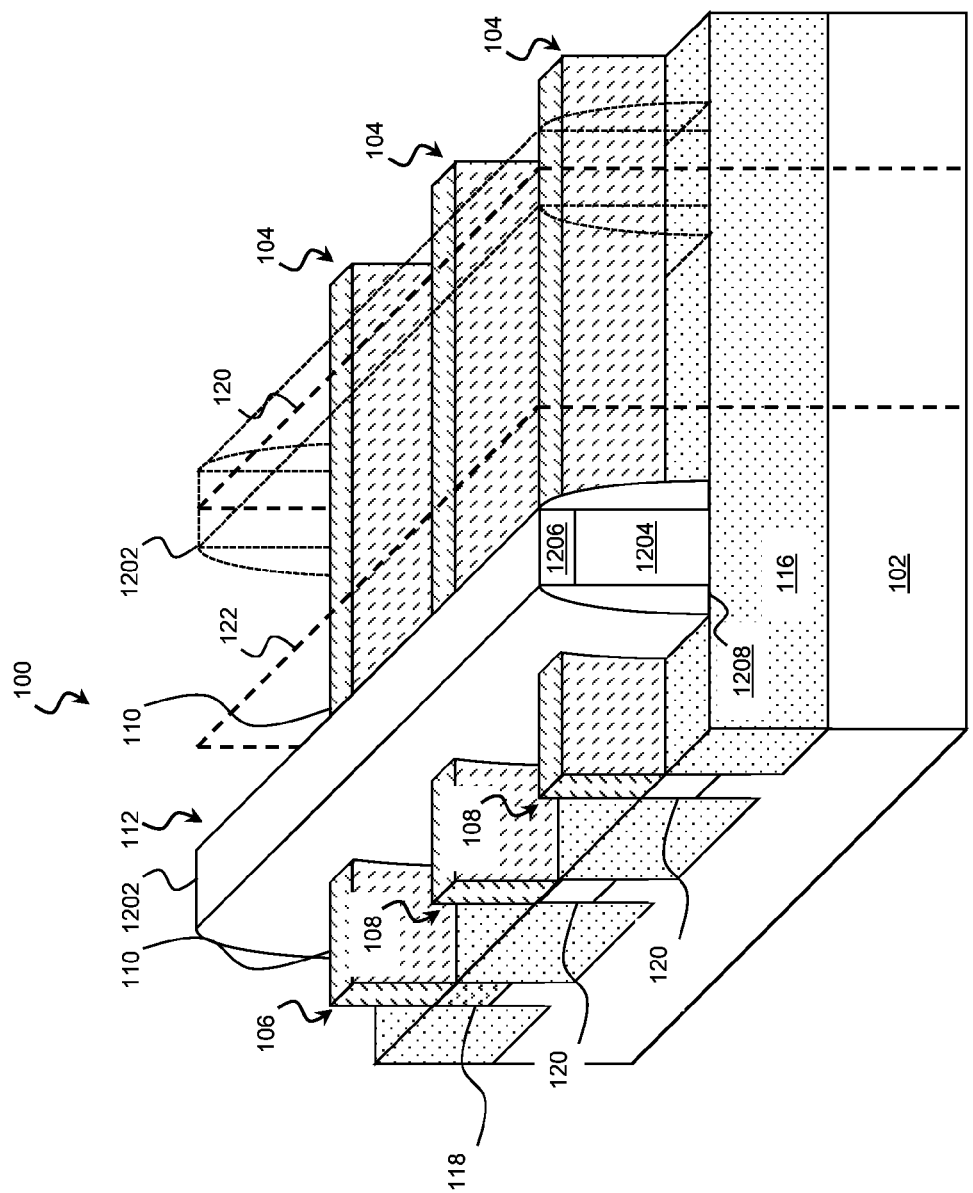
FIG. 12 is a perspective view of a portion of the workpiece undergoing the method for forming a FinFET according to various aspects of the present disclosure.

Referring to block 220 of FIG. 2 and to FIG. 11, the fused layer 1002 is etched back to be aligned with the vertical boundary between the fin structure 104 and the isolation feature 116. The etching may use any suitable technique including dry etching, wet etching, RIE, and/or other etching methods, and may use any suitable etching chemistry. The etching of block 220 may also remove the capping layer 904.

Source/drain features 1502 are then formed on the workpiece 100. Until this point, the source/drain regions 110 and the channel regions 112 have undergone substantially similar processes. However, referring to block 222 of FIG. 2 and to FIG. 12, a protective structure such as a dummy gate 1202 is formed over the channel region 112 to protect it during the processing of blocks 222-230. Forming the dummy gate 1202 may include depositing a dummy gate layer 1204 containing polysilicon or other suitable material and patterning the layer in a lithographic process. A gate hard mask layer 1206 may be formed on the dummy gate layer 1204. The gate hard mask layer 1206 may include any suitable material, such as a semiconductor oxide, a semiconductor nitride, a semiconductor carbide, a semiconductor oxynitride, other suitable materials, and/or combinations thereof.

In some embodiments, gate spacers 1208 or sidewall spacers are formed on each side of the dummy gate 1202 (on the sidewalls of the dummy gate 1202). The gate spacers 1208 may be used to offset the subsequently formed source/drain features 1502 and may be used for designing or modifying the source/drain structure (junction) profile. The gate spacers 1208 may include any suitable dielectric material, such as a semiconductor oxide, a semiconductor nitride, a semiconductor carbide, a semiconductor oxynitride, other suitable materials, and/or combinations thereof.

Referring to block 224 of FIG. 2 and to FIGS. 13A and 13B, a third hard mask 1302 is formed over the fused layer 1002 within the source/drain regions 110. The third hard mask 1302 is shown in FIG. 13B as that view corresponds to a cross section taken through the source/drain regions 110, whereas FIG. 13A, which corresponds to a cross section taken through the channel region 112, shows the dummy gate layer 1204 and gate hard mask layer 1206 of the dummy gate 1202.

The third hard mask 1302 shown in FIG. 13B is used to align the epitaxial growth of the source/drain features 1502 after a portion of the fused layer 1002 is removed. The third hard mask 1302 may include any suitable dielectric material including semiconductor oxides, semiconductor nitrides, semiconductor oxynitrides, semiconductor carbides, combinations thereof, and/or other suitable materials. An exemplary third hard mask 1302 includes silicon nitride. In various embodiments, the third hard mask 1302 is formed using one or more suitable processes including thermal growth, ALD, CVD, HDP-CVD, PVD, and/or other suitable deposition processes.

Referring to block 226 of FIG. 2 and to FIGS. 14A and 14B, the third hard mask 1302 and the fused layer 1002 within the source/drain regions 110 are etched. The etching leaves a portion of the fused layer 1002 remaining to act as a seed layer for a subsequent epitaxial growth process. In various embodiments, the fused layer 1002 remaining after the etching has a thickness between about 3 nm and about 10 nm. The technique may also leave a portion of the third hard mask 1302 extending above the top surface of the fused layer 1002 in order to control and align the epitaxial growth of the source/drain features 1502. The etching may be performed as a single etching process or as multiple etching processes using a variety of etchants and techniques. In an exemplary embodiment, an anisotropic (directional) etching technique, such as an anisotropic dry etching technique, is used that etches the horizontal surfaces of the third hard mask 1302 and the fused layer 1002 faster than the vertical surfaces.

Referring to block 228 of FIG. 2 and to FIGS. 15A and 15B, raised source/drain features 1502 are formed on the fused layer 1002. The dummy gate 1202 and/or gate spacers 1208 limit the source/drain features 1502 to the source/drain regions 110, and the third hard mask 1302 limits the source/drain features horizontally within the source/drain regions 110. In many embodiments, the source/drain features 1502 are formed by one or more epitaxy or epitaxial (epi) processes, whereby Si features, SiGe features, and/or other suitable features are grown in a crystalline state on the fin structure 104. Suitable epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 104.

The source/drain features 1502 may be in-situ doped during the epitaxy process by introducing doping species including: p-type dopants, such as boron or $BF_2$; n-type dopants, such as phosphorus or arsenic; and/or other suitable dopants including combinations thereof. If the source/drain features 1502 are not in-situ doped, an implantation process (i.e., a junction implant process) is performed to dope the source/drain features 1502. In an exemplary embodiment, the source/drain features 1502 in the NMOS region 302 include SiP, while those in the PMOS region 304 include GeSnB (tin may be used to tune the lattice constant) and/or SiGeSnB. One or more annealing processes may be performed to activate the source/drain features 1502. Suitable annealing processes include rapid thermal annealing (RTA) and/or laser annealing processes.

Figure 16A:
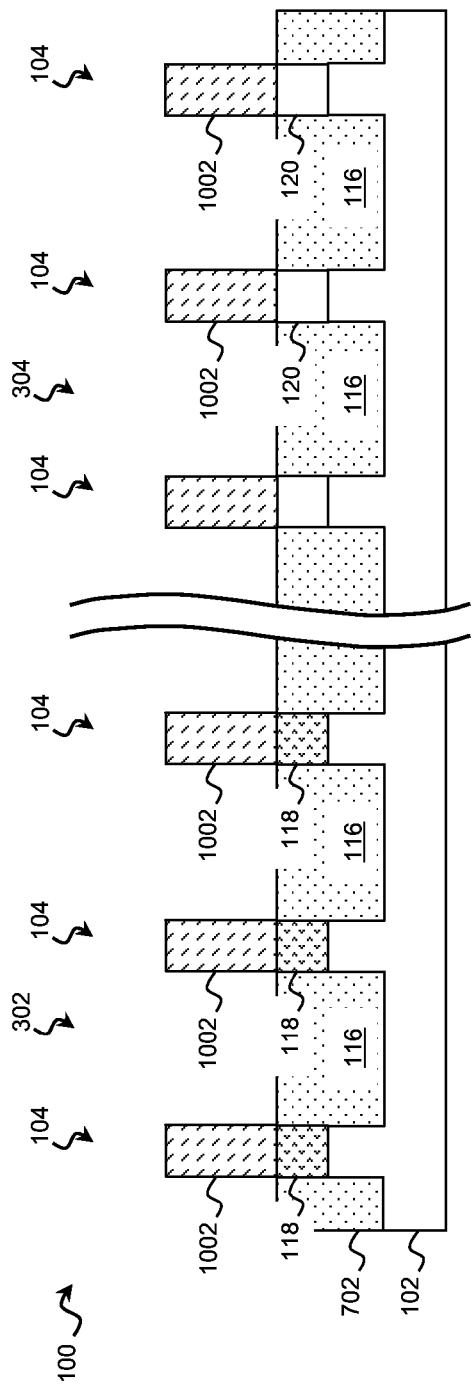
Figure 16B:
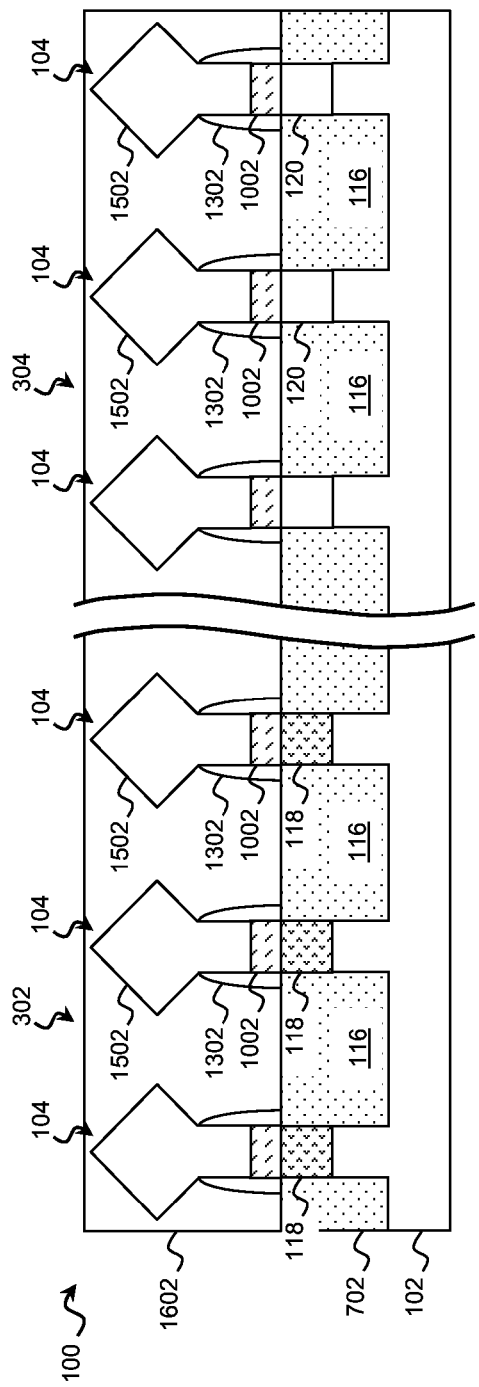

Referring to block 230 of FIG. 2 and to FIGS. 16A and 16B, an inter-level dielectric (ILD) 1602 is formed on the source/drain features 1502 in the source/drain regions 110. The ILD 1602 may surround the dummy gate 1202 and/or gate spacers 1208 allowing these features to be removed and a replacement gate 114 to be formed in the resulting cavity. Accordingly, in such embodiments, the dummy gate 1202 is removed after depositing the ILD 1602 as shown in FIG. 16A. The ILD 1602 may also be part of an electrical interconnect structure that electrically interconnects the devices of the workpiece including the FinFET devices 106 and 108. In such embodiments, the ILD 1602 acts as an insulator that supports and isolates the conductive traces. The ILD 1602 may comprise any suitable dielectric material, such as a semiconductor oxide, a semiconductor nitride, a semiconductor oxynitride, a semiconductor carbide, other suitable materials, and/or combinations thereof.

Referring to block 232 of FIG. 2 and to FIGS. 17A and 17B, a gate stack 114 is formed on the workpiece 100 wrapping around the channel regions 112 of the fin structures 104. Although it is understood that the gate stack 114 may be any suitable gate structure, in some embodiments, gate stack 114 is a high-k metal gate that includes an interfacial layer 1702, a dielectric layer 1704, and a metal gate layer 1706 that may each comprise a number of sub-layers.

In one such embodiment, the interfacial layer 1702 is deposited by a suitable method, such as ALD, CVD, ozone oxidation, etc. The interfacial layer 1702 may include an oxide, HfSiO, a nitride, an oxynitride, and/or other suitable material. Next, a high-k dielectric layer 1704 is deposited on the interfacial layer 1702 by a suitable technique, such as ALD, CVD, metal-organic CVD (MOCVD), PVD, thermal oxidation, combinations thereof, and/or other suitable techniques. The high-k dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfSiO, $(Ba,Sr)TiO_3$ (BST), $Al_2O_3$, $Si_3N_4$, oxynitrides (SiON), or other suitable materials.

A metal gate layer 1706 is then formed by ALD, PVD, CVD, or other suitable process, and may include a single layer or multiple layers, such as a metal layer, a liner layer, a wetting layer, and/or an adhesion layer. The metal gate layer 1706 may include Ti, Ag, Al, TiAlN, TaC, TaCN, TaSiN, Mn, Zr, TiN, TaN, Ru, Mo, Al, WN, Cu, W, or any suitable materials. In some embodiments, different metal gate materials are used for nMOS and pMOS devices. A CMP process may be performed to produce a substantially planar top surface of the gate stack 114. After the gate stack 114 is formed, the workpiece 100 may be provided for further fabrication, such as contact formation and further fabrication of the interconnect structure.

Thus, the present disclosure provides a technique for controlling the channel strain of nonplanar semiconductor devices by forming a first buried layer that provides a tensile strain for NFET devices and a second buried layer that provides a compressive strain for PFET devices. In some embodiments, a semiconductor device is provided. The semiconductor device includes a substrate and a fin structure formed on the substrate. The fin structure includes opposing source/drain regions disposed above a surface of the substrate; a channel region disposed between the opposing source/drain regions and disposed above the surface of the substrate; and a buried layer disposed between the channel region and the substrate, wherein the buried layer includes a compound semiconductor oxide. In some such embodiments, the buried layer includes a SiGe oxide. In one such embodiment, the semiconductor device also includes a second fin structure that corresponds to a PMOS device and that includes a buried layer disposed between the substrate and a channel region of the second fin structure, wherein the buried layer of the second fin structure is different from the buried layer of the first fin structure.

In further embodiments, a semiconductor device is provided that includes a substrate, an NMOS FinFET formed on the substrate, and a PMOS FinFET formed on the substrate. The NMOS FinFET includes a first insulator layer having a first composition and formed on the substrate; and an n-channel region formed on the first insulator layer such that the first insulator layer isolates the n-channel region from the substrate. The PMOS FinFET includes a second insulator layer formed on the substrate, wherein the second insulator layer has a second composition that is different from the first composition; and a p-channel region formed on the second insulator layer such that the second insulator layer isolates the p-channel region from the substrate. In some such embodiments, the NMOS FinFET includes a source/drain structure adjacent the n-channel region, and wherein the source/drain structure includes a seed layer formed on the first insulating layer and an epitaxial structure disposed on the seed layer.

In yet further embodiments, a method of fabricating a nonplanar circuit device is provided. The method includes: receiving a workpiece having a first fin structure for a first device of a first type and a second fin structure for a second device of a second type, wherein each of the first fin structure and the second fin structure includes: a buried layer disposed on a substrate and a semiconductor layer disposed on the buried layer; based on the first device being of the first type, performing an oxidation process on the buried layer of the first fin structure; epitaxially growing a source/drain feature of the first device in a source/drain region of the first fin structure; and forming a gate structure of the first device over a channel region of the first fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate; and
   a fin structure formed on the substrate, wherein the fin structure includes:
   opposing source/drain regions disposed above a surface of the substrate;
   a channel region disposed between the opposing source/drain regions and disposed above the surface of the substrate; and
   a buried layer disposed between the channel region and the substrate, wherein the buried layer includes a compound semiconductor oxide, and
   wherein the opposing source/drain regions each include a seed layer disposed on the buried layer, and an epitaxial portion disposed on the seed layer.

2. The semiconductor device of claim 1, wherein the buried layer includes a SiGe oxide.

3. The semiconductor device of claim 1, wherein the fin structure corresponds to an NMOS device.

4. The semiconductor device of claim 3, wherein the fin structure is a first fin structure, the semiconductor device further comprising:
   a second fin structure that corresponds to a PMOS device and that includes a buried layer disposed between the substrate and a channel region of the second fin structure, wherein the buried layer of the second fin structure is different from the buried layer of the first fin structure.

5. The semiconductor device of claim 4, wherein the buried layer of the first fin structure includes a SiGe oxide, and wherein the buried layer of the second fin structure is free of the SiGe oxide.

6. The semiconductor device of claim 1, wherein the buried layer includes SiGe with a graded concentration of Ge with a lower concentration of Ge at a first portion closer to the substrate than at a second portion further from the substrate.

7. The semiconductor device of claim 6, wherein the graded concentration of Ge increases from about 20 atomic percent to about 60 atomic percent.

8. The semiconductor device of claim 1, wherein the seed layer includes SiGe with a Ge concentration between about 20 atomic percent and about 70 atomic percent.

9. A semiconductor device comprising:
   a substrate;
   a NMOS FinFET formed on the substrate, wherein the NMOS FinFET includes:
   a first insulator layer having a first composition and formed on the substrate; and
   an n-channel region formed on the first insulator layer such that the first insulator layer electrically isolates the n-channel region from the substrate; and a PMOS FinFET formed on the substrate, wherein the PMOS FinFET includes:
  a second insulator layer formed on the substrate, wherein the second insulator layer has a second composition that is different from the first composition; and
  a p-channel region formed on the second insulator layer such that the second insulator layer electrically isolates the p-channel region from the substrate.

10. The semiconductor device of claim 9, wherein the first insulator layer includes a SiGe oxide.

11. The semiconductor device of claim 10, wherein the second insulator layer is free of the SiGe oxide.

12. The semiconductor device of claim 10, wherein the first insulator layer includes a graded concentration of Ge that is lower in a portion of the first insulator layer closer to the substrate than in a portion of the first insulator layer further from the substrate.

13. The semiconductor device of claim 12, wherein the graded concentration increases from about 20 atomic percent to about 60 atomic percent.

14. The semiconductor device of claim 9, wherein the NMOS FinFET includes a source/drain structure adjacent the n-channel region, and wherein the source/drain structure includes a seed layer formed on the first insulating layer and an epitaxial structure disposed on the seed layer.

15. A semiconductor device comprising:
  a substrate;
  a first fin structure formed on the substrate, wherein the first fin structure includes:
    opposing source/drain regions disposed above a surface of the substrate;
    a channel region disposed between the opposing source/drain regions and disposed above the surface of the substrate; and
    a first buried layer disposed between the channel region and the substrate, wherein the first buried layer includes a compound semiconductor oxide; and
  a second fin structure formed on the substrate, wherein the second fin structure includes:
    a second buried layer disposed between the substrate and a channel region of the second fin structure, wherein the second buried layer is different from the first buried layer.

16. The semiconductor device of claim 15, wherein one of the first and second buried layers includes a SiGe oxide.

17. The semiconductor device of claim 16, wherein the other of the first and second buried layers does not include SiGe oxide.

18. The semiconductor device of claim 15, wherein the first buried layer includes SiGe with a graded concentration of Ge with a lower concentration of Ge at a first portion closer to the substrate than at a second portion further from the substrate, and wherein the graded concentration of Ge increases from about 20 atomic percent to about 60 atomic percent.

19. The semiconductor device of claim 18, wherein the opposing source/drain regions each include a seed layer disposed on the buried layer, and an epitaxial portion disposed on the seed layer.

20. The semiconductor device of claim 15, wherein the first fin structure corresponds to an NMOS device and the second fin structure corresponds to a PMOS device.

* * * * *